United States Patent
Syväjärvi et al.

(10) Patent No.: US 7,918,937 B2
(45) Date of Patent: Apr. 5, 2011

(54) METHOD OF PRODUCING SILICON CARBIDE EPITAXIAL LAYER

(75) Inventors: Mikael Syväjärvi, Ulrika (SE); Rositsa Yakimova, Linköping (SE)

(73) Assignee: EL-Seed Corp., Nagoya (JP)

( * ) Notice: Subject to any disclaimer, the term of this patent is extended or adjusted under 35 U.S.C. 154(b) by 0 days.

(21) Appl. No.: 11/990,335

(22) PCT Filed: Aug. 17, 2006

(86) PCT No.: PCT/EP2006/008130
§ 371 (c)(1),
(2), (4) Date: Feb. 12, 2008

(87) PCT Pub. No.: WO2007/020092
PCT Pub. Date: Feb. 22, 2007

(65) Prior Publication Data
US 2009/0126624 A1     May 21, 2009

Related U.S. Application Data

(60) Provisional application No. 60/708,786, filed on Aug. 17, 2005.

(51) Int. Cl.
*C30B 25/02* (2006.01)
(52) U.S. Cl. .............................. 117/84; 117/200; 117/951
(58) Field of Classification Search .................... 117/84, 117/200, 951
See application file for complete search history.

(56) References Cited

U.S. PATENT DOCUMENTS

| | | | |
|---|---|---|---|
| 4,147,572 A | 4/1979 | Vodakov et al. | |
| 5,865,658 A * | 2/1999 | Watkins | 445/25 |
| 6,261,363 B1 | 7/2001 | Vodakov et al. | |
| 6,770,136 B2 * | 8/2004 | Kuhn et al. | 117/200 |
| 2002/0038627 A1 | 4/2002 | Vodakov et al. | |
| 2002/0059901 A1 | 5/2002 | Vodakov et al. | |
| 2002/0083891 A1 | 7/2002 | Vodakov et al. | |
| 2003/0037724 A1 | 2/2003 | Snyder et al. | |

FOREIGN PATENT DOCUMENTS

| | | |
|---|---|---|
| WO | WO 01/04389 | 1/2001 |
| WO | WO 01/04391 | 1/2001 |
| WO | WO 01/68954 | 9/2001 |

OTHER PUBLICATIONS

St. G Muller et al.: "Electronic and Optical properties of vanadium doped silicon carbide crystals grown by the sublimation sandwich method" Semi-conducting and semi-insulating materials conference, 1996. IEEE Toulouse, France Apr. 29-May 3, 1996, New York, NY USA IEEE, US, Apr. 29, 1996, pp. 219-222, XP010213147 ISBN: 0-7803-3179-6.

* cited by examiner

*Primary Examiner* — Robert M Kunemund
(74) *Attorney, Agent, or Firm* — Harness, Dickey & Pierce, PLC

(57) ABSTRACT

A method of producing an epitaxial layer on a substrate of silicon carbide is provided. Utilizing the system, silicon carbide can be grown with a thickness uniformity that is better than 5% at a growth rate which is at least 100 μm/hour. The method comprises providing a cavity with a source material and a substrate of monolithic silicon carbide, evacuating the cavity and raising the temperature to 1400° C. Then the temperature is increased at a rate of about 20° C./min until a predetermined growth temperature is reached. Thereafter, the temperature is kept such that a predetermined growth rate between 10 μm/min and 300 μm/min is obtained.

11 Claims, 5 Drawing Sheets

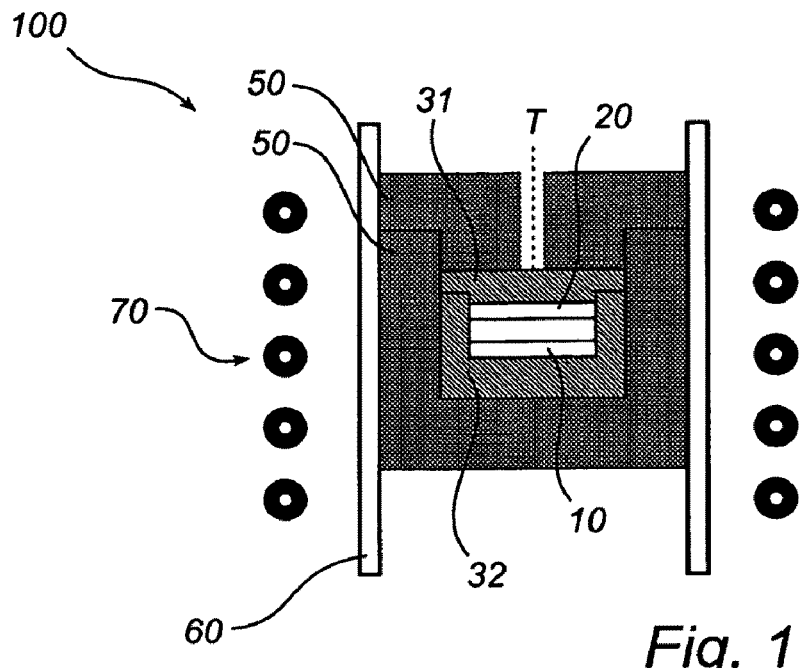
Fig. 1
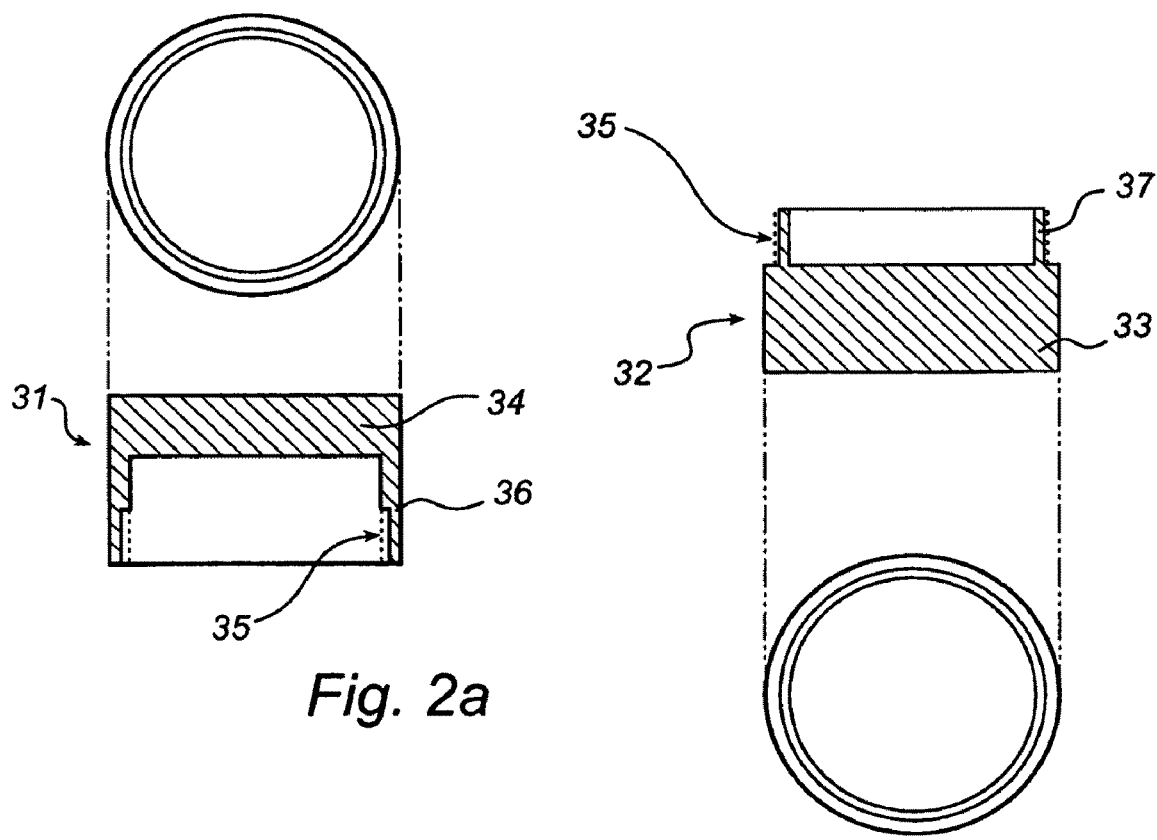
Fig. 2a
Fig. 2b

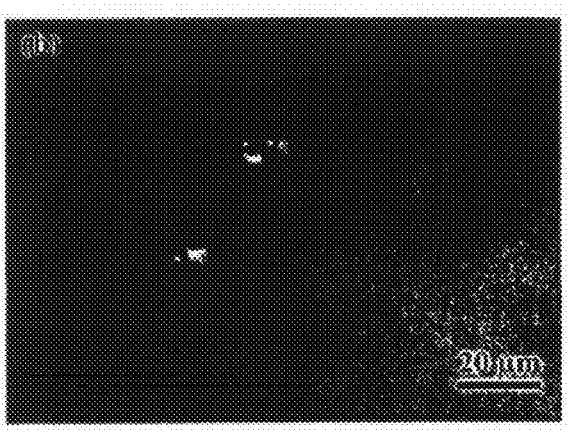
Fig. 6a Fig. 6b
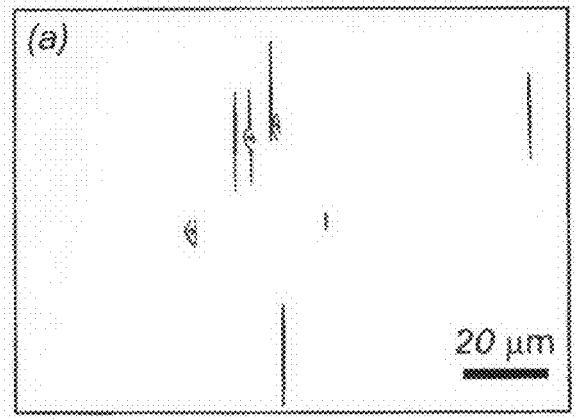
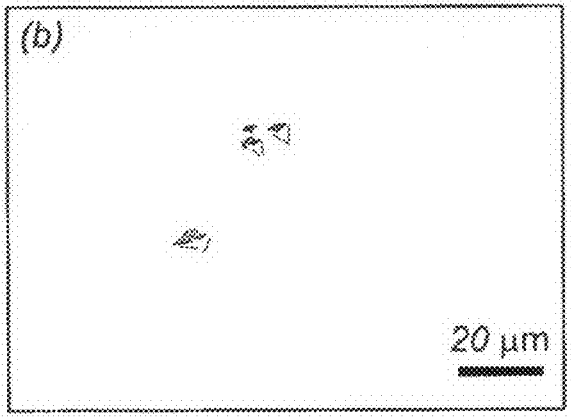
Fig. 6a′ Fig. 6b′
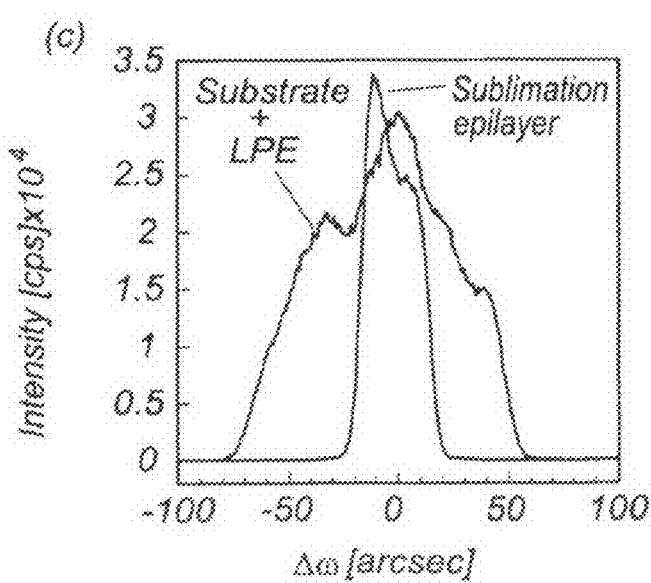
Fig. 6c

METHOD OF PRODUCING SILICON CARBIDE EPITAXIAL LAYER

CROSS-REFERENCE TO RELATED APPLICATION

This application claims the benefit under 35 U.S.C. §119 of U.S. Provisional Application No. 60/708,786, filed on Aug. 17, 2005, in the United States Patent and Trademark Office.

TECHNICAL FIELD

The inventions relate generally to growth of epitaxial layers on a substrate. Specifically the inventions relate to sublimation epitaxial growth with a high growth rate. More specifically the invention relates to sublimation epitaxial growth of a thick layer of silicon carbide on a silicon carbide substrate.

BACKGROUND ART

In recent years, there has been an increasing demand for electronic devices capable of operation at high power levels and high temperatures. With a very high thermal conductivity (about 4.9 W/cm), high saturated electron drift velocity (about $2.7*10^7$ cm/s) and high breakdown electric field strength (about 3 MV/cm), silicon carbide is a suitable material for high temperature, high voltage and high power application. These applications may e.g. imply blocking voltages in excess of 10 kV, conduction current greater than 100 A at a switch rate of more than 150 kHz. Such high power devices will require areas in excess of 1 cm$^2$ and thick (about 100-200 μm) epitaxial layers, or epilayers, with good surface morphology and low defect density. Future devices might require even thicker layers. Hence, a manufacturing process facilitating a reproducible growth of thick, high quality layers at a high growth rate is most desirable.

It has been repeatedly shown that threading defects like micropipes, screw and edge dislocations in SiC commercial wafers are device performance limiting defects. Further, high-power devices normally requires low-doped (e.g. $10^{13}$-$10^{15}$ cm$^{-3}$) epitaxial layers.

Surface morphology of the epitaxial layers is an important characteristic since morphological defects may hamper device characteristic of the final semiconductor device. In addition, the epitaxial growth mode of SiC is determined by step-flow mechanism, and hence the growth of thick layers normally put high demands on morphology due to the inherent amplification of surface features, e.g. a pronounced enlargement of substrate imperfections such as polish-induced scratches, polytype inclusions and micropipes when conventional methods are used. Further, the high growth temperature, chemical stability, and the lack of congruent melting of SiC set limitations to the crystal growth methods. Attempts have been made to use High Temperature Chemical Vapor Deposition (HTCVD) for producing thick epitaxial layers without succeeding in achieving satisfactory high reproducibilities at sufficiently high growth rates.

An object of the inventions is to overcome or alleviate the above mentioned drawbacks.

SUMMARY OF THE INVENTIONS

A first invention is based on an insight by the inventors that if the temperature increase of the source material at sublimation epitaxy is properly controlled prior to the growth phase, high quality epitaxial layers can be achieved at growth rates exceeding 100 μm/h with high reproducibility by means of sublimation epitaxy. A method according to said first invention is defined by claim 1.

The temperature increase of the substrate and the cavity containing said substrate affects the composition of Si and C at the growth surface, and is a requirement for growth. When the temperature increase is too fast, e.g. higher than about 25° C./min, the composition of the vapor with silicon and carbon bearing species changes to a composition with silicon being in excess over an optimum vapor composition, and nucleation of silicon droplets causes an unfavorable initial growth. When the temperature increase is too slow, e.g. lower than about material and the substrate such as pressure and molecular content.

A second invention is based on an insight by the inventors into how to design an inner container, and how to arrange the source material and the substrate inside said inner container, in order to raise the growth rate and improve the quality of the epitaxial layers at sublimation epitaxy by providing suitable growth conditions. According to a first aspect of said second invention, a separation, such as a gap or void, is provided between the inner wall and the closest component, at the upper portion of said inner container. In the context of the invention an upper portion of the container is a portion of the container which is closer to the substrate compared to the source material. Said space between the inner wall of the container and the substrate facilitates an improved growth rate due to increased heat losses from the backside of the substrate. In the context of these inventions, a front side of the substrate is the side on which said epitaxial layer is grown.

A third invention is based on an insight by the inventors that the quality of the produced epitaxial layers can be increased at sublimation epitaxy by providing a C-getter in the shape of a foil or plate in close contact with a side of the source material facing the lower part of the container, i.e. in close contact with a side of the source material opposite to the one facing the substrate. The C-getter is preferably a foil which comprises Tantalum, although other configurations and materials with suitable RF coupling and which acts as a C-getter can be used in order to obtain a sufficiently uniform temperature distribution and a desired vapor control. Said materials preferably comprises Hafnium, Tungsten and/or Rhenium. The arrangement of the foil provides a more uniform temperature distribution across the substrate. Hence, this facilitates an improved thickness uniformity and improves the quality of the produced epitaxial layer. Typically, the variation in thickness uniformity of the epitaxial layer is less than 10%, preferably less than 5% and even more preferred less than 2% across the epitaxial layer. Moreover, the variation in doping uniformity of the epitaxial layer is less than 20%, preferably less than 10% and even more preferred less than 5% across the epitaxial layer.

When epitaxial layers are produced in accordance with one or several of the above described inventions the quality of the resulting layers is improved. In the context of the inventions the following terminology will be used when describing epitaxy defects.

Scratches, which are grooves or cuts below the surface plane having a length to width ratio of 5:1, caused by existing scratches in the substrate.

Large discrete defects, which are defects which spatial diameter >10 μm. These include obstacles, particles, inclusions, and other defects with visible shapes.

Extended linear defects, having a length to width ratio greater than 5:1 and appearing in epitaxial growth with length >10 μm.

Step bunching, which is a visible pattern of parallel lines running perpendicular to the step flow direction. Further the term Epidefects is used to describe defects caused by e.g. particle downfall during the manufacturing process, which causes disturbances in the epitaxial surface.

Advantageously, when a construction according to one or several of said inventions are used, normally a higher growth rate is achieved at a lower temperature compared to other constructions used for sublimation epitaxy.

The construction and method of operation of the invention, together with additional objects and advantages thereof will be better understood from the following description of specific embodiments when read in conjunction with the accompanying drawings. 15° C./min, the composition at the growing epilayer changes toward a reduced vapor composition by increased carbon content, and thus graphitization occurs, which provides unfavorable growth conditions.

An idea behind the first invention is to introduce the suitable temperature rise sufficiently early in the manufacturing process, such that unfavorable growth is substantially prevented at a sufficiently early stage. A temperature increase of about 20° C./min or between 15° C./min and 25° C./min, which is initiated at least before the source material have started to sublime, causes an initial sublimation of both source and substrate. This initial sublimation acts to sublime surface damage residues, prior to initial disposition by vapor transport from source to substrate. Hence, the quality of the resulting epitaxial layer is improved. Said transport preferably proceeds at a stable temperature until a layer of desired thickness has been grown.

The inventive method can be used to produce epitaxial layers with controlled layer properties, such as surface termination, and doping of both n and p-type in the range $5 \times 10^{13}$ to $5 \times 10^{16}$ cm$^{-3}$. Further, the method can be used to produce epitaxial layers having a top surface diameter of e.g. 300 mm. The controlled doping is preferably ensured by a pre-heating in vacuum and use of a C-getter which may be prepared prior to epitaxial growth. Further, epitaxial layer having a thickness of 500 μm can be achieved at a growth rate of more than 100 μm/h and a reproducibility of more than 90%. Moreover, when a method according to said first invention is used, the surface properties, such as surface smoothness, of the epitaxial layer are improved.

In sublimation epitaxy crucial factors which determine the growth rate and the surface quality are among others the temperatures of the source material and the substrate, and the environment surrounding the source Said substrate and source material should be monolithic, and said source material is preferably polycrystalline, i.e. has a polycrystalline structure.

BRIEF DESCRIPTION OF THE DRAWINGS

FIG. 1 is a schematic cross sectional view of the system.

FIGS. 2*a* and 2*b* exemplifying cross sectional views of an inner container according to said second invention.

FIGS. 6*a*-6*e* are exemplifying illustrations of the quality of epitaxial layers when produced by sublimation epitaxy in accordance with said first invention.

DETAILED DESCRIPTION OF PREFERRED EMBODIMENTS

Figure 3A:
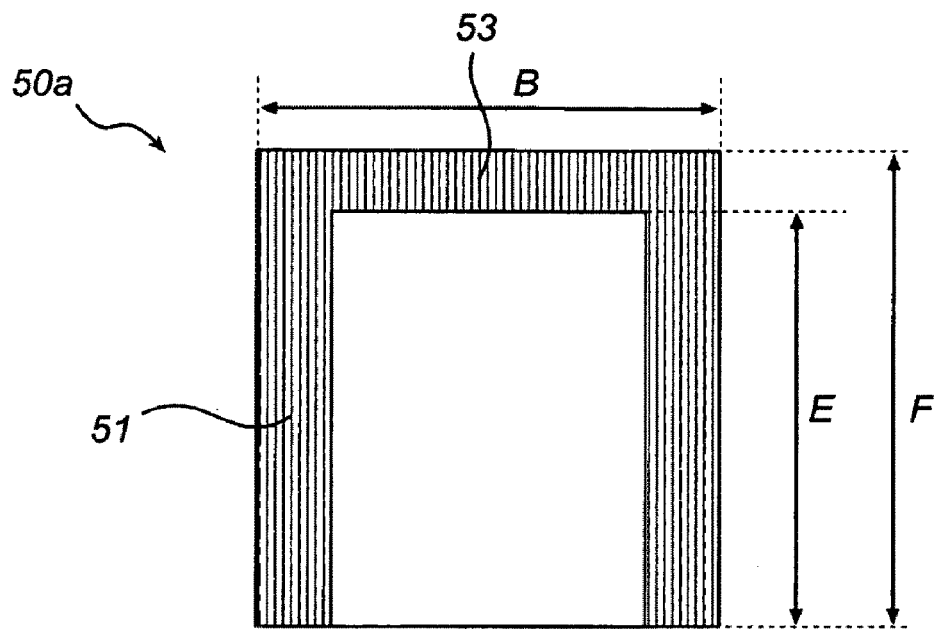
FIGS. 3*a*-3*c* are exemplifying cross sectional views of an isolation container.

In all the figures sub-features and integral parts that correspond to one another bear the same reference symbol. Referring now to the figures of the drawings in detail and first, particularly, to FIG. 1.

FIG. 1 is a schematic illustration of a system 100 designed to facilitate sublimation epitaxy with high growth rate and high reproducibility, which enables the growth of thick epitaxial layers. In the context of the invention a thick epitaxial layer is thicker than 10 μm, or preferably thicker than 30 μm, or more preferably thicker than 50 μm, and most preferably thicker than 100 μm. The source material 10 and the substrate 20 are arranged in a cavity of an inner container 31, 32. The inner container 31, 32 is arranged within an insulating container 50, which insulating container 50 in turn is arranged in an outer container 60. Outside said outer container 60 there are heating means 70, which can be used to heat the cavity of said inner container 31, 32. According to this embodiment the heating means 70 comprises an induction coil for radiofrequency heating. Said outer container 60 is in this example a quartz tube, and said insulating container 50 and said inner container 31, 32 are cylindrical, and made of an insulating graphite foam and high density graphite, respectively. The heating means 70 is used to heat the container and by this sublime the SiC source 10. The heating means 70 is movable in a vertical direction in order to adjust the temperature and thermal drop in the inner container 31, 32. The temperature drop between the source material 10 and substrate 20 can also be altered by varying the properties of the inner container 31, 32, such as the thicknesses of the top part 31 and the bottom part 32 as is known in the art. Additionally, there are pumps for evacuating the inner container (not shown), i.e. to provide a pressure between about $10^{-4}$ and $10^{-6}$ mbar.

FIGS. 2*a* and 2*b* are drawings of an exemplifying inner container 31, 32, having a tubular shape, which is made of high density graphite. High density graphite is used as it withstands high temperatures and facilitates a coupling to the electromagnetic field generated by the RF-coils, in order to facilitate heating of the content of the inner container. FIG. 2*a* illustrates the upper part 31 of the inner container and FIG. 2*b* illustrates the bottom part 32 of the inner container, respectively. When the inner radius of the container 31, 32 is adjusted to the radius of the source material 10 and the substrate 20, these are easily centered in the container 31, 32. The container 31, 32 shown in FIGS. 2*a* and 2*b*, the diameter of which is 52 mm, is specifically suitable for growth on substrates having a diameter of about 2 inch.

Further, the height of the base 33 of the container 32, according to this embodiment 36 mm, is preferably substantially higher than the height of the top 34 of the container 31, according to this embodiment 6 mm, in order to facilitate a suitable temperature gradient within the inner container 31, 32, and also in order to improve temperature uniformity in a horizontal direction or a direction substantially orthogonal to the cylinder axis of said container 31, 32 or a direction orthogonal to an epitaxial layer growth direction. The temperature gradient is preferably 1-5° C./mm. Such uniform temperature distribution is important for the thickness and doping uniformity of the epitaxial layers.

Moreover, the container 31, 32 preferably is provided with tightening means 35, such as a catch or threads, in order make the container sufficiently leakproof and avoid losses of vapor species, particularly silicon, to such amounts that the stability of growth is disturbed. The base 32 of FIG. 2*b* is provided with threads 35, having a pitch of 2 mm, on the outer side of its wall means 37. The lid 31 of FIG. 2a is provided with corresponding threads 35 on the inner side of its lower wall means 36.

Figure 3B:
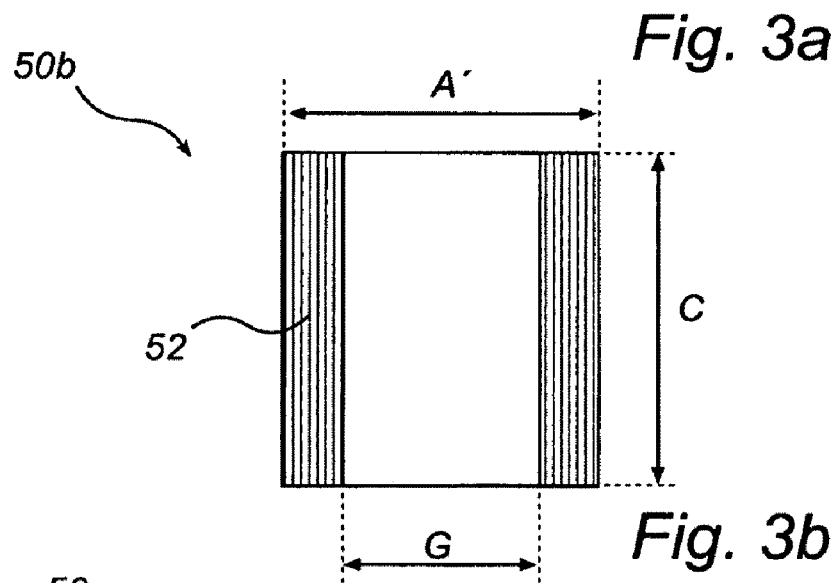
Figure 3C:
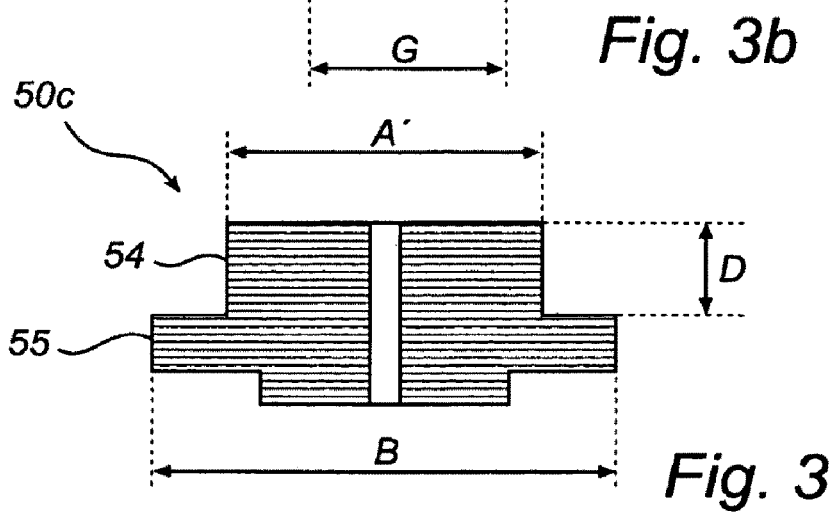

FIGS. 3a-3c are exemplifying drawings of an insulation container 50, which comprises dual walls 51, 52 in order to provide additional heat insulation. In other words, the insulation container 50 comprises a first cylinder 50a and a second cylinder 50b, each formed of monolithic graphite foam having a fiber direction which is parallel to the axis of the respective cylinder, i.e. the center axis of the cylinder. When used, the second cylinder 50b is arranged within the first cylinder 50a such that the fiber direction of said first cylinder 50a is orthogonal to the fiber direction of said second cylinder 50b. In other words, the layers forming the graphite foam of each cylinder 50a and 50b are arranged orthogonal to each other. Thus, an improved thermal insulation is provided compared to when a single cylinder is used.

Additionally, said insulating container preferably comprises a bottom part 50c, arranged such that its fiber direction is substantially orthogonal to the fiber directions of said first and second cylinders 50a and 50b, in order to reduce heat losses in a direction parallel to the axes of said cylinders. Further, the outer cylinder 50a preferably comprises a top part or top portion 53, which fiber direction is parallel to the axis of the cylinder 50a, such that an improved heat loss is provided through the top of the cylinder.

Said insulation container is adapted to facilitate a conventional growth direction, i.e. a growth direction which is in parallel with the cylinder axis of the graphite foam containers 50a, 50b, wherein the substrate is arranged closer to the top part 53 of the first cylinder 50a compared to the source material.

According to a preferred embodiment the first cylinder 50a has an inner diameter A and an outer diameter B, and the second cylinder 50b has an outer diameter A'. Wherein A' is only slightly smaller than A, such that the second cylinder 50b fits tightly inside the first cylinder. Preferably, the inner diameter of the first cylinder 50a is about 1% larger than the outer diameter of the second cylinder 50b. For example, if the outer diameter of the second cylinder 50b is about 99.5 mm, the inner diameter of the first cylinder is suitably 100.5 mm. Additionally, the outer diameter of said first cylinder is preferably equal to 150 mm. Further, the bottom part 50c has a cylindrical upper portion 54 with an outer diameter preferably equal to A', such that it fits inside the first cylinder 50a.

Further, the bottom part 50c is provided with a projecting element which is able to provide support for said first and second cylinder 50a, 50b when the second cylinder 50b and the bottom portion is arranged inside said first cylinder 50a. Hence the length of the projecting element 55, is larger than A and preferably substantially equal to B.

Moreover, if the height of the first cylinder is C and the height of the top portion 54 of said bottom part 50c is D, the inner height of said first cylinder 50a is preferably E, which is larger than C+D such that a gap is provided between the top of the second cylinder 50b and the inner surface of the top portion 53. Preferably a gap which is about 3% of the height of said second cylinder 50b is provided. In other words, if the height of the second cylinder 50b is 100 mm and the height of the bottom part 50c is 30 mm, the inner height of the first cylinder is preferably about 133 mm—such that a gap of 3 mm is provided between the top of the second cylinder and the inner top surface of the first cylinder. Additionally, the outer height F of said first cylinder 50a is preferably equal to 160 mm. And there is preferably a channel, which is for example 10 mm wide, in the bottom portion.

Finally, the inner diameter G of said second cylinder 50b is preferably slightly larger than the inner container 31, 32 which is to be used. If said inner container has an inner diameter of 52 mm and an outer diameter of about 60 mm, the inner diameter of said second cylinder 50b is preferably about 62 mm.

The above mentioned system design has a number of advantages. In particular, the system is designed such that a higher and more even heat distribution at the substrate and the source material is achieved. This is favorable as a higher temperature increases the growth rate, and a more even heat distribution improves the quality of the epitaxial layer. The geometry of the insulation container and the inner container contribute to establish desired temperature profiles which are necessary for obtaining growth conditions at which high quality material can be obtained. Although particular measures have been given as examples in relation to FIGS. 1-3 there are other designs which also gives the desired growth conditions.

Figure 4:
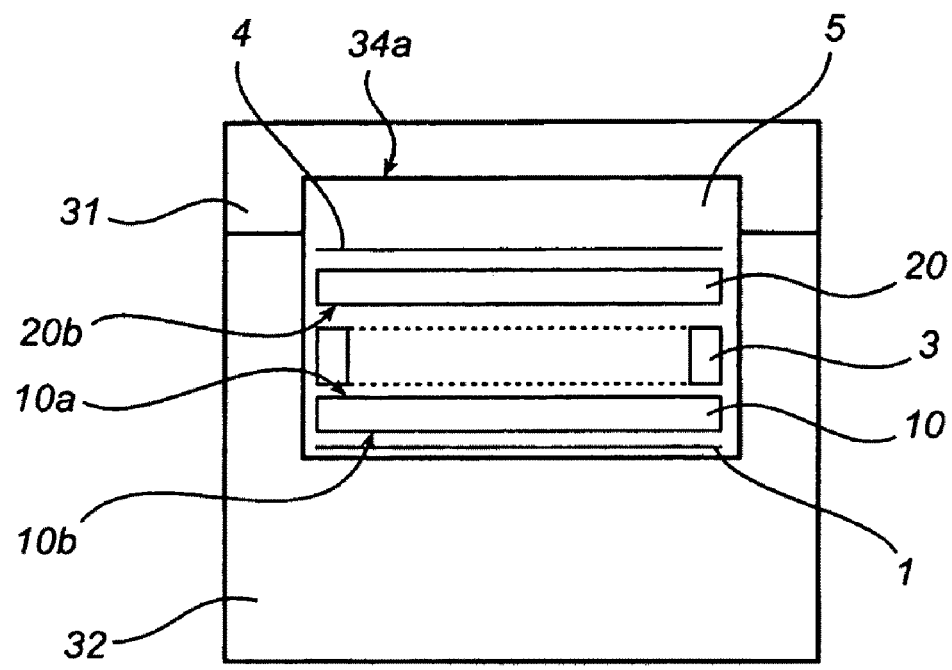
FIG. 4 is a schematic illustration of an exemplifying arrangement of the components inside said inner container.

FIG. 4 is a schematic illustration of a preferred arrangement of components 1, 3, 4, 10, 40 within the inner container 31, 32. Each of the components 1, 3, 4, 10, 40 have a radius of approximately 51 mm. A foil of tantalum 1, which height is approximately 0.1-0.3 mm, is located at the bottom of the container 31, 32. Besides facilitating an thickness uniformity, the tantalum foil 1 facilitates a control of the vapor stoichiometry inside the container. A source material 10 is arranged on top of the foil 1. The height of the source material is approximately 0.5-2 mm. The source 10 is preferably a high-purity material which is poly-crystalline. Use of poly-crystalline source material 10 gives more uniform feeding to the growing epilayer 20b, and thus more uniform properties of layer thickness and doping compared to a mono-crystalline material. A spacer 3, which height is approximately 1 mm, separates the source material 10 from a substrate 20, which height is approximately 0.3-0.4 mm. Preferably, the substrate 20 comprises a silicon carbide crystal which has a mirror-like surface and a minimum of surface defects. On top of said substrate 20 a plate 4 of e.g. high density graphite can be arranged in order to even the temperature distribution across the substrate surface and reduce the sublimation at the surface of the substrate facing the plate 4. The height of the plate 4 is approximately 0.5 mm. The inner height of the inner container 31, 32, i.e. the height of the cavity, is approximately 12 mm and the total height of said components 1, 3, 4, 10, 40 is between about 2.5 mm and about 4 mm. Hence, there is a gap 5 of about 8-9.5 mm between the graphite plate 4 and the ceiling 34a of the cavity according to this embodiment. Preferable the graphite plate 4 is separated from the cavity ceiling 34a by a distance of at least 2 mm, more preferably by a distance of at least 3 mm and most preferred by a distance of at least 5 mm.

The arrangement of the tantalum foil 1 underneath and in contact with the source material 10 gives an improved temperature distribution across the source material 10 horizontally i.e. in a direction orthogonal to the growth direction of the epilayer. In other words, as the tantalum foil 1 couples to the induction RF field an increased heating of the source material 10 is provided. The foil 1 also facilitates a more even heat distribution across the surface 10b of the source material 110 facing the foil. Consequently, the heat is also more evenly spread axially across the substrate, i.e. towards the opposite surface 10a of the source material 10, which gives more uniform properties of the epitaxial layer.

A more even temperature distribution is provided to the substrate 20 by the gap 5 between the graphite plate 4 and the ceiling of the cavity 34a, and this provides a suitable heat exchange such that the growth of the epilayer is improved.

The separation between the graphite plate 4, or when nothing is arranged above the substrate 4 a separation from the substrate 20 provides high heat losses from the backside of the structure 1, 3, (4), 10, 40 and hence high growth rates, as the thermal gradient within the cavity is increased. Preferably, the substrate 20 is not attached to the graphite plate 5 or the top of the container 31, as such an attachment would give a resulting epitaxial layer of lower quality due to e.g. an increased density of defects and surface inhomogenities.

Preferably, the thickness of the tantalum foil 1 is chosen carefully. When it is made too thin the foil will deform, which adversely effect the temperature distribution and surface quality. When it is made too thick it will release impurities, such as aluminum compounds comprised therein. A low doped epitaxial layer is reached by use of high-purity graphite material and a suitable Ta foil, some of which properties are determined by the preparation of the foil prior to growth.

Figure 5:
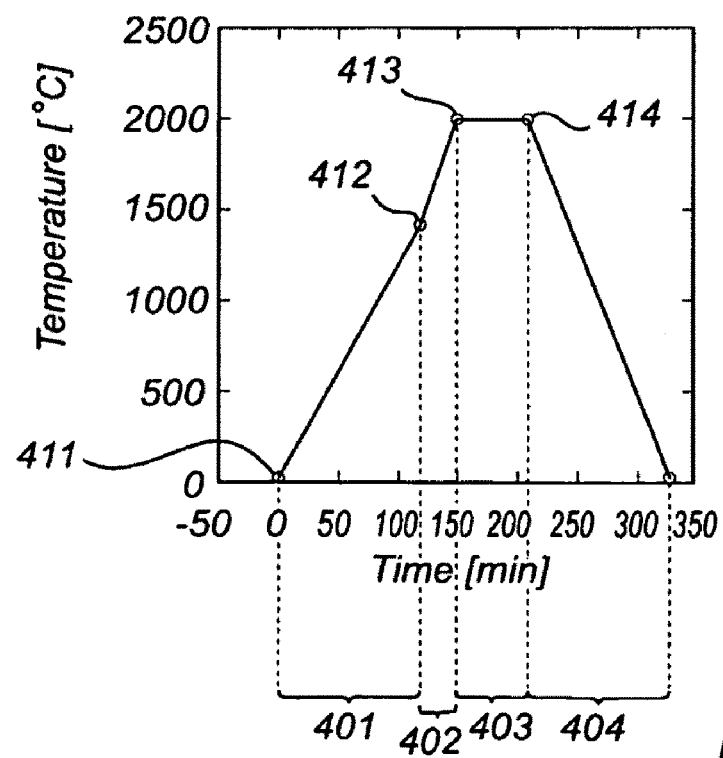
FIG. 5 is a graph illustrating a temperature variation of the source material during sublimation growth according to said first invention.

The method will now be described with reference to a system design as described above, but the man skilled in the art knows that the design is only an example and other that other designs can also be used as long as the desired growth conditions are achieved. FIG. 5 schematically illustrates the temperature variation at the substrate during the epitaxial sublimation. The growth process comprises a pre-heating phase 401 wherein the system is set up for example in accordance with the above description, and the inner container is evacuated using conventional pumping means. A base vacuum level of lower than $10^{-4}$ mbar is normally desired. This pressure is kept substantially constant during the entire process.

In order to achieve a high quality epitaxial layer and a high growth rate it is important to accurately control the rate at which silicon and carbon atoms escapes form the surface of said source material or the SiC surfaces. This rate is mainly controlled by the temperature of the source material, and the temperature difference between the source material and the substrate. Below a temperature of 1400° C. essentially no silicon and carbon atoms is released from the SiC surfaces. At a temperature above 1400° C. the SiC surfaces start to decompose and silicon and carbon atoms can be expected to be released from these surfaces into the cavity at temperatures slightly higher than 1400° C. The exact temperature at which this occurs depends on the exact properties of the SiC-material.

A net flow of silicon and carbon atoms from the source material to the substrate will not form, until the amount of released silicon and carbon atoms have saturated the vapor at the substrate surface. When the saturation is obtained, the transport of vapor species from the source material to the substrate is driven by the temperature drop between the source and substrate, wherein the substrate has a lower temperature than the source material. An efficient transfer is obtained by growth in vacuum, which favors growth of thick layers with high speed.

The inventors have discovered that when said directed flow has formed the increase of the temperature is preferably between 15° C./min-25° C./min, and more preferably about 20° C./min. Such a temperature increase provides a good initial sublimation of the source and nucleation. The speed of the initial sublimation and nucleation is important since this creates slow deposition at the first stages of growth, which is important for the quality of the layers. Too fast temperature ramp-up will yield obstacles which cause defective quality, and too slow ramp-up will also give defects, e.g. step-bunching. Also, with the optimized ramp-up the surface of the substrate will slightly sublime before nucleation takes place, and this is important for the surface quality. Hence, sublimation epitaxy according to this method is not as sensitive as Chemical Vapor Deposition (CVD) to polishing scratches in the initial substrate.

In the context of this invention the period, wherein the temperature of the source material is raised from a first ambient temperature 411 to a second temperature 412 at which the cavity is saturated with silicon and carbon atoms, is referred to as the pre-heating phase 401. When a low doping of the epitaxial layer is desired, the pre-heating phase is preferably quite long, e.g. 2 hours, such that gas emitted from the graphite material is substantially evacuated, before the directed flow of silicon and carbon atoms from the source material to the substrate is formed. When the substrate and the source material have a temperature which is below 1400° C. the process is normally not sensitive to the rate of the temperature increase. In order to ensure that a temperature increase of between about 15° C.-25° C., and preferably about 20° C., is established before the cavity is saturated and a net flow of silicon and carbon atoms is formed, the raise of temperature increase is initiated already at a temperature 412 of about 1400° C. The period starting at 412 is called the heating phase 402. As stated above, at the sublimation temperature for the SiC surfaces, i.e. at a temperature of about 1550° C., both the starting surface and the substrate sublime until the surfaces of the cavity is saturated, whereupon there is a net transfer from the source material to the substrate.

The temperature is raised at a rate of between 15°/min and 25°/min, until a desired growth temperature 413 of typically about 2000° C., 1900° C.-2100° C., is reached. When a suitable growth temperature 413 has been reached, i.e. a growth temperature which facilitates a desired growth rate, the temperature increase is quickly decreased. The man skilled in the art knows at which temperatures a desired growth rate is obtained. The temperature is kept at this level 413, until an epitaxial layer of desired thickness has been achieved. The period following the heating phase is referred to as the growth phase 403, during this phase the temperature is preferably kept substantially constant.

When a desirably thick layer has been produced 414 the heating is turned off and the substrate is allowed to cool, this is referred to as the cooling phase 404. The pre-heating and the cooling phase can be optimized in order to decrease the production time.

Figure 6D:
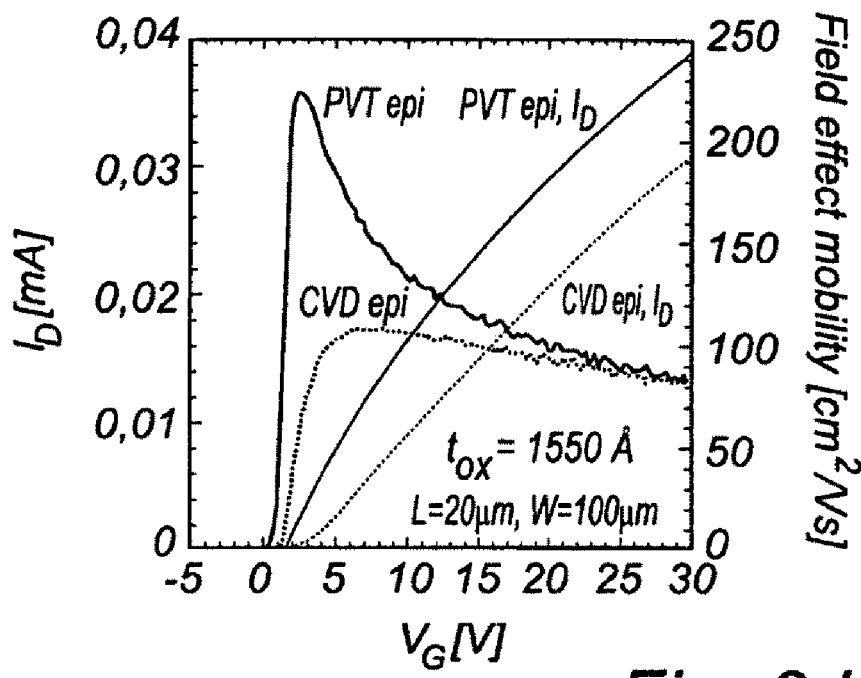

By providing suitable atom sources the above described method can be used to produce substrates which have desired doping properties. For example, by providing one or several sources which provides Aluminum, Boron and Nitrogen atoms, the above described method can be used to fabricate thick layers of high quality and which are doped with Nitrogen and either Boron or Aluminum, whose interaction may produce luminescence. In this context one example of an atom source is the atmosphere surrounding the substrate, another a piece of material containing the desired atoms which material is provided inside the inner container, a third an external source which provides the desired atmosphere, i.e. the external source is arranged outside the inner container. FIGS. 6a-6d illustrates the quality improvement in an epitaxial layer manufactured according to the inventive method. FIG. 6a shows an optical microscopy image of a substrate containing a Liquid Phase Epitaxy (LPE) layer which shows steps (long elongated lines) and three areas with localized defects from the substrate. FIG. 6a' is a schematic illustration of the photo shown in FIG. 6a.

FIG. 6b shows a 50 μm thick sublimation epitaxy layer subsequently grown in accordance to the inventive method on the LPE surface, shown in FIG. 6a, at the same area. The sublimation epitaxy layer clearly demonstrates a smoother surface while defective areas from the substrate remain. FIG. 6b' is a schematic illustration of the photo shown in FIG. 6b.

FIG. 6c shows two ω-rocking curves from the areas shown in FIGS. 6a and 6b, respectively, with a narrower peak from the sublimation layer than in the substrate. This also shows that the structural quality has improved by sublimation epitaxy. In these measurements the X-rays impinging on a sample are reflected and the reflected X-rays appear as a peak in the detection with narrower peak as the structural quality is better, and thus serves to qualitatively compare SiC wafers or epilayers. In normal epitaxial growth direct on a substrate surface the resulting surface is smoother than in this example grown on an LPE layer on a substrate. This example is intended to demonstrate that the surfaces are improved even on initially rough surfaces, which in production of epitaxial layers normally is a polished substrate.

Figure 6E:
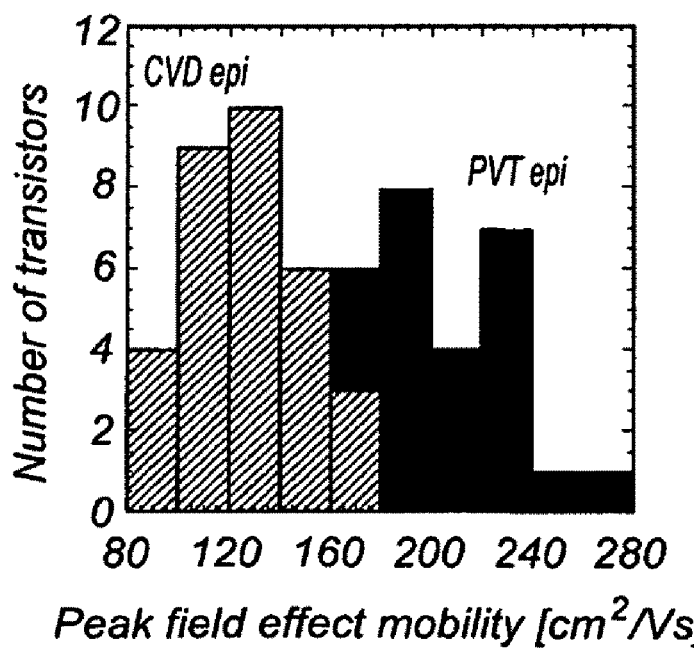

In metal-on-semiconductor devices, which were prepared on CVD layers and sublimation layers simultaneously, important properties such as channel mobility and interface state density proved to be better on the sublimation material compared to the CVD materials. Two transistor batches were simultaneously prepared, one on sublimation grown layer and one on a CVD layer which thus acted as reference samples. All process steps were done at the same time for both layers. In comparison, the peak field effect mobility is increased in the sublimation grown material, as shown in FIGS. 6d and 6e.

FIG. 6d illustrates the field effect mobility and drain current as a function of gate voltage for transistors with a sublimation grown epilayer and a commercial CVD grown epilayer. The drain voltage is 0.1 V. FIG. 6e illustrates the peak field effect mobility statistics for long channel (>10 μm) transistors. The average mobility in devices with sublimation epitaxy is 210 cm$^2$/Vs with a standard deviation of 27 cm$^2$ and, 130 cm$^2$/Vs with a standard deviation of 22 cm$^2$/Vs for transistors with CVD epitaxy, which is a very high value for a 4H-MOSFET transistor. More information can be found in Sveinbjörnsson et al, Mater. Sci. Forum 483-485, 841 (2005), which is hereby incorporated by way of reference.

When a method and preferably also a structure as described in relation to FIG. 1-5 is used and the resulting properties of the epitaxial layer is determined in comparison to commercial material, it is shown that scratches and step-bunching normally do not appear, and that the total number of other defects is reduced by more than 50% in the layers produced in accordance with the invention. Moreover, a high reproducibility of the surface quality and the polytype is achieved. Uniformity in doping and thickness of the epitaxial layer is determined, by measuring the standard deviation over the mean value, to less than 5% in e.g. a layer grown on a 2 inch wafer.

An example, when growing an epitaxial layer having a resulting thickness of 100 μm at a rate of about 100 μm/h the following properties of the epitaxial layer was achieved with a reproducibility of more than 90%:
large discrete defects #0-20;
scratches #0;
lines #0;
step bunching #0;
epidefects (4H/6H) #25/50.

Moreover, at a growth rate of about 250 μm/h the above listed defects were achieved with a reproducibility of about 75% for a 100 μm thick epitaxial layer.

As a reference, a 50 μm thick epitaxial layer available from Cree today has the following specifications:
large discrete defects #60;
scratches #10;
step bunching (8° off)<10% affected;
epidefects (4H/6H) #113/203.

High quality thick epitaxial layers can be achieved by a container arranged in accordance with said second invention, but there are also other container designs which enables the growth of thick layers having a desired quality, i.e. which provides the necessary growth conditions. These containers can be selected by the man skilled in the art. In other words, the measures in the figures are only given as non limiting examples.

Although the present invention has been described in detail in connection with the discussed embodiments, various modifications may be made by one of ordinary skill in the art without departing from the spirit and scope of the present invention. Further, the method can be used to produce more than one layer in the same cavity as is readily realized by the man skilled in the art.

The invention claimed is:

1. A method of producing an epitaxial layer on a substrate of silicon carbide comprising:
providing a cavity comprising a source material and a substrate, both comprising monolithic silicon carbide;
establishing in said cavity a pressure between $10^{-4}$ mbar and $10^{-6}$ mbar, and a first temperature of at least 1400° C. at said substrate and a temperature gradient of between 1 and 5° C./mm directed from said source material to said substrate;
increasing said first temperature at a rate of between 15° C./min and 25° C./min until a growth temperature is reached; and
keeping the temperature about said growth temperature such that a growth rate of between 10 μm/h and 300 μm/h is achieved.

2. A method according to claim 1, wherein the pressure in the cavity is kept between $10^{-4}$ mbar and $10^{-6}$ mbar while the temperature is raised from said first temperature to said growth temperature.

3. A method according to claim 2, wherein the pressure in the cavity is kept between $10^{-4}$ mbar and $10^{-6}$ mbar during the growth of said epitaxial layer.

4. A method according to claim 1, wherein said growth rate is between 100 μm/h and 200 μm/h.

5. A method according to claim 1, wherein said source material has a polycrystalline structure.

6. A method according to claim 1, wherein the step of providing a source material comprises providing a source material having a first surface and an opposite second substantially flat surface, wherein said first surface is arranged to face said substrate, and further comprises providing a C getter, shaped as a plate or foil, in close contact with said second side of said source material.

7. A method in accordance with claim 6, wherein said C getter is a tantalum foil.

8. A method according to claim 1, wherein the first temperature is below about 1600° C.

9. A method according to claim 1, wherein the first temperature is below about 1500° C.

10. A method according to claim 1, wherein the growth temperature is between about 1900° C. and about 2100° C.

11. A method according to claim 1, wherein the growth temperature is about 2000° C.

* * * * *